US006859021B2

(12) United States Patent
Link

(10) Patent No.: US 6,859,021 B2
(45) Date of Patent: Feb. 22, 2005

(54) CIRCUIT ARRANGEMENT FOR CONTROLLING A POWER SUPPLIED TO A LOAD

(75) Inventor: Ulrich Link, Bernhardswald (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 10/734,679

(22) Filed: Dec. 15, 2003

(65) Prior Publication Data

US 2004/0174719 A1 Sep. 9, 2004

Related U.S. Application Data

(63) Continuation of application No. PCT/DE02/02107, filed on Jun. 10, 2002.

(30) Foreign Application Priority Data

Jun. 15, 2001 (DE) .................................... 201 09 957 U

(51) Int. Cl.[7] .................................................. G05F 1/40
(52) U.S. Cl. ........................ 323/284; 323/304; 323/288
(58) Field of Search ................................ 323/282, 283, 323/284, 285, 288, 304, 311, 351

(56) References Cited

U.S. PATENT DOCUMENTS

| | | | | |
|---|---|---|---|---|
| 4,300,090 A | | 11/1981 | Weber | |
| 4,754,213 A | | 6/1988 | Dubot et al. | |
| 5,550,463 A | | 8/1996 | Coveley | |
| 5,604,387 A | | 2/1997 | Cheyne | |
| 5,644,214 A | * | 7/1997 | Lee | 323/288 |
| 5,767,631 A | | 6/1998 | Konopka et al. | |
| 5,811,963 A | | 9/1998 | Elwell | |
| 6,117,735 A | | 9/2000 | Ueno | |

FOREIGN PATENT DOCUMENTS

| | | |
|---|---|---|
| DE | 42 29 440 A1 | 3/1994 |
| DE | 198 07 517 A1 | 8/1999 |
| EP | 0 892 485 A2 | 1/1999 |
| JP | 2000150875 | 5/2000 |

OTHER PUBLICATIONS

Peter Friedrichs, et al., " SiC Power Devices with Low On–Resistance for Fast Switching Applications", ISPSD 2000– 12$^{th}$ IEEE International Symposium on Power Semiconductor Devices & ICs, Toulouse, Siemens AG, Corporate Research and Development A&D SD E6, pp. 213–216.

* cited by examiner

*Primary Examiner*—Jessica Han
(74) *Attorney, Agent, or Firm*—Sughrue Mion, PLLC

(57) ABSTRACT

A circuit for controlling the power supplied to a load. The circuit includes a controlled self-conducting semiconductor switch (4) connected in-series with the load (2). Further, a first energy storage circuit (9*a*) is provided in-series with the load and includes a first energy storage element (6*a*) and a first rectifier (8*a*) connected in-series thereto. A controlled auxiliary switch (12) is also included in the circuit in-parallel fashion to the first energy storage element. A control sub-circuit (13) is provided near the energy storage element which is associated with the self-conducting semiconductor switch and the auxiliary switch. The control sub-circuit closes or opens the auxiliary switch when the voltage on the first energy storage element exceeds a predetermined first value or falls short of a predetermined second value.

14 Claims, 10 Drawing Sheets

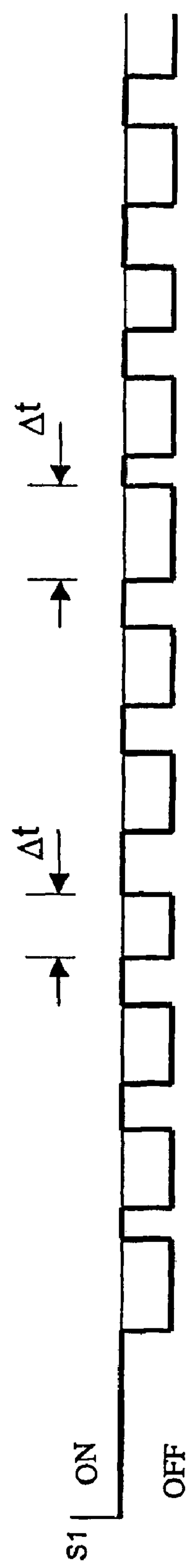
FIG 3
FIG 4
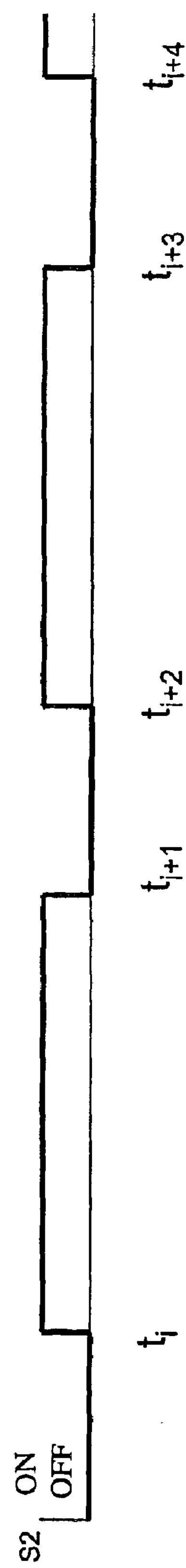
FIG 5

CIRCUIT ARRANGEMENT FOR CONTROLLING A POWER SUPPLIED TO A LOAD

This is a Continuation of International Application PCT/DE02/02107, with an international filing date of Jun. 10, 2002, which was published under PCT Article 21(2) in German, and the disclosure of which is incorporated into this application by reference.

FIELD OF AND BACKGROUND OF THE INVENTION

This invention relates to a circuit arrangement for controlling power supplied to a load, comprising a controllable self-conducting semiconductor switch connected in-series with a load.

The semiconductor switches used in power electronics, e.g., IGBTs, MOSFETs, thyristors or GTOs, are usually self-blocking. Semiconductor switches based on silicon carbide SiC have excellent properties making their use desirable in comparison with semiconductor switches based on silicon; this is because of their high dielectric strength, low resistance when conducting and their suitability for very high switching frequencies. Self-blocking switches based on silicon carbide SiC are not currently available commercially, however.

From ISPSD 2000—12th IEEE International Symposium on Power Semiconductor Devices & ICS, Toulouse, P. Friedrichs et al., "SiC power devices with low on-resistance for fast switching applications," pp. 213–216, it is known that a self-conducting VJFET switch (VJFET =vertical junction FET) based on silicon carbide SiC can be combined with a self-blocking MOSFET to form a cascade, so that an electronic component which is self-blocking toward the outside is again obtained.

However, in applications, e.g., in a current supply in which a circuit arrangement for controlling the power supplied to a load is always supplied with power when it is at voltage, i.e., in operation, it is not absolutely necessary for a semiconductor switch used as a power switch in this circuit arrangement to be self-blocking. Instead, essentially a self-conducting controllable semiconductor switch may also be used alone in such applications. However, this leads to the problem that current begins to flow through the self-conducting semiconductor switch when the power supply of voltage is applied to the circuit arrangement. Therefore, there is the need for a trigger device for the self-conducting semiconductor switch to be operable within the shortest possible period of time, so that the trigger device can turn the switch off before the occurrence of an operating disturbance, e.g., an overload.

OBJECTS OF THE INVENTION

An object of the invention is to provide a circuit arrangement for controlling the power supplied to a load comprising a controllable semiconductor switch connected in-series with the load. Further, the circuit arrangement has a simple design and also permits the use of a self-conducting controllable semiconductor switch.

SUMMARY OF THE INVENTION

The above and other objects are achieved according to this invention with a circuit arrangement having a controllable self-conducting semiconductor switch connected in-series with the load and a first energy storage circuit also connected in-series with the load. The first energy storage circuit includes a first energy storage device and a first rectifier connected in-series and a terminal of the first energy storage device is connected to a terminal of the self-conducting semiconductor switch. A controllable auxiliary switch is included which is connected in-parallel with the first energy storage device and a control circuit is further provided which corresponds to the self-conducting semiconductor switch and the auxiliary switch. The control circuit is operable to sense a voltage from the first energy storage device and close and open the auxiliary switch, respectively, when the voltage from the first energy storage device exceeds a predetermined first value and falls below a predetermined second value.

The electric current flowing through the load and the self-conducting semiconductor switch when the line voltage is applied is thus first sent through the energy storage unit and the rectifier. The voltage built up on the energy storage unit supplies power to the control circuit which controls the self-conducting semiconductor switch as well as the auxiliary switch. When the voltage on the first energy storage unit exceeds a predetermined first value or falls below a predetermined second value, the auxiliary switch is opened or closed, respectively, by the control circuit. This measure ensures that the voltage on the first energy storage unit is always sufficient to maintain functioning of the control circuit.

The first value and the second value are preferably different, the first value being of a higher absolute value than the second value. This implements a switching hysteresis and reduces the switching frequency of the auxiliary switch.

In an advantageous embodiment of this invention, the control circuit is designed so that it switches the controllable auxiliary circuit only when the self-conducting semiconductor switch is opened. Since the auxiliary switch is switched to be currentless, there are no switching losses. In addition, this minimizes the potential shift on the first energy storage unit as well as that on the connected consumers and thus the EMV radiation.

In another advantageous embodiment, means are provided for correcting the ON time of the self-conducting semiconductor switch as a function of the switch stage of the auxiliary switch, the ON time (sampling ratio) of the self-conducting semiconductor switch being increased in particular when the auxiliary switch is open. Therefore the power consumption by the load, which is reduced due to the charging of the first energy storage unit, can be compensated, preferably by prolonging the ON time of the self-conducting semiconductor switch so that the integral of the voltage on the load over the ON time (voltage-time area) is equal to the voltage-time area that would be applied to the load if the auxiliary switch were closed.

In particular, the control circuit comprises a monitoring device for monitoring the voltage of the first energy storage unit and for generating a switching signal for closing the self-conducting semiconductor switch when this voltage falls below a predetermined limit value when the auxiliary switch is open.

In another preferred embodiment of this invention, a SiC VJFET, in particular a current-limiting SiC VJFET, is provided as the self-conducting semiconductor switch. This ensures that the load current will not exceed the allowed limit values even if a longer charging time of the first energy storage unit becomes necessary.

In an especially simple embodiment of this invention, a capacitor in particular is provided as the first energy storage unit, the capacitor preferably being designed so that the resonant frequency of the oscillating circuit formed by an inductive component of the load and the capacitor is much smaller than the lowest switching frequency of the self-conducting semiconductor switch.

In an advantageous embodiment of this invention, a second energy storage circuit is connected is parallel with the auxiliary circuit and includes a second energy storage unit and a second rectifier connected in-series between the second energy storage unit and the self-conducting semiconductor switch. A power supply voltage, which is thus provided via the second energy storage unit, can be used to supply the additional consumers, which must have a fixed reference potential with respect to the power supply voltage.

Supplementary to this a third energy storage circuit is connected in-parallel with the first rectifier in another embodiment and includes a series connection of a third rectifier and a third energy storage unit, generating a bipolar power supply voltage jointly together with the second energy storage circuit.

In another embodiment a safety device for detecting the electric current flowing through the self-conducting semiconductor switch is provided, preferably comprising a bistable flip-flop, and generating a control signal for opening the self-conducting semiconductor switch when a predetermined limit value is exceeded. When a current-limiting SiC VJFET is used as the self-conducting semiconductor switch, it is possible to use a slow protective device having a slow response time, as these can be manufactured especially easily and in a sturdy design.

BRIEF DESCRIPTION OF THE DRAWINGS

For further illustration of this invention, reference is made to the exemplary embodiments in the drawings, which show:

FIGS. 3–5 are diagrams in which the control signal for the self-conducting semiconductor switch, the voltage on the first energy storage unit and the control signal for the auxiliary switch are plotted as a function of time;

DETAILED DESCRIPTION OF THE PREFERRED EMBODIMENTS

Figure 1:
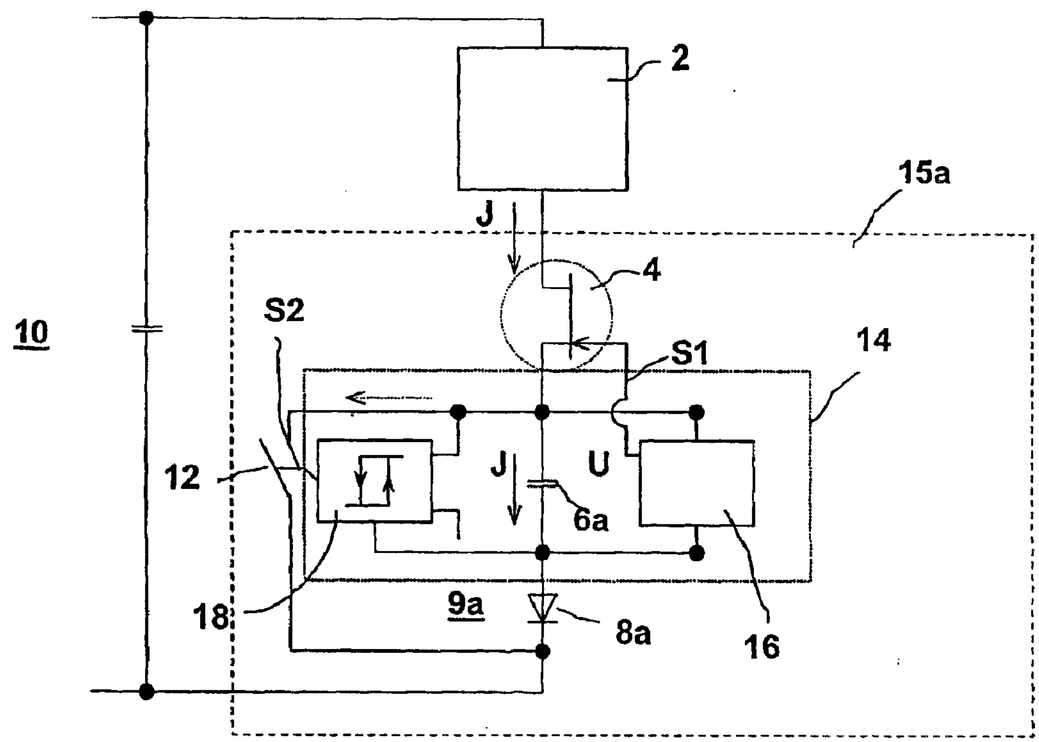
FIG. 1 shows a circuit arrangement according to this invention in a schematic diagram.

According to FIG. 1, a load 2 is connected to a voltage source 10 in-series with a self-conducting semiconductor switch 4, a first energy storage unit 6*a*, namely a capacitor in this example, and a first rectifier 8*a*, a diode in this example. The self-conducting semiconductor switch 4 is preferably a VJFET, in particular a current-limiting VJFET based on silicon carbide SiC (SiC VJFET). In this exemplary embodiment, an n-channel VJFET is shown in which the current flows from the voltage source 10 over the load 2 to the semiconductor switch 4.

The first energy storage circuit 9*a* formed from the first energy storage device 6*a* and the first rectifier 8*a* is connected in-series with the self-conducting semiconductor switch 4 in such a way that one terminal of the first energy storage device 6*a* is connected to the terminal, namely the source terminal of the VJFET in the exemplary embodiment, on which its control potential is based. In the exemplary embodiment (n-channel VJFET) the first energy storage device 9*a* is connected downstream from the semiconductor switch because it is necessary to lower the potential below the source potential for shutdown.

A controllable auxiliary switch 12 is connected in-parallel with the first energy storage circuit 9*a*. When the auxiliary switch 12 is opened, the current I flowing through the load 2 and the self-conducting semiconductor switch 4 flows through the first energy storage unit 6*a* and the first rectifier 8*a*. With the auxiliary switch 12 closed, the first energy storage circuit 9*a* is bridged so that the current I flowing through the load 2 and the self-conducting semiconductor switch 4 then flows over the closed auxiliary switch 12, as illustrated by the arrow shown with a broken line in the figure. The first rectifier 8*a* in this case prevents the discharge of the first energy storage device 6*a* via the closed auxiliary switch 12.

A control circuit 14 which is assigned to the self-conducting semiconductor switch 4 and the auxiliary switch 12 generates the control signals S1 and/or S2 required for switching the semiconductor switch 4 and the auxiliary switch 12. In the exemplary embodiment in the figure, the control circuit 14 comprises a first and a second triggering unit 16 and 18, respectively, for generating the control signals S1 and/or S2.

The self-conducting semiconductor switch 4, the auxiliary switch 12, the control circuit 14 with the energy storage circuit 9*a* contained in it as well as the rectifier 8*a* together form an in-channel switching element 15*a*, and some or all of these components may be monolithically integrated into a module.

Figure 2:
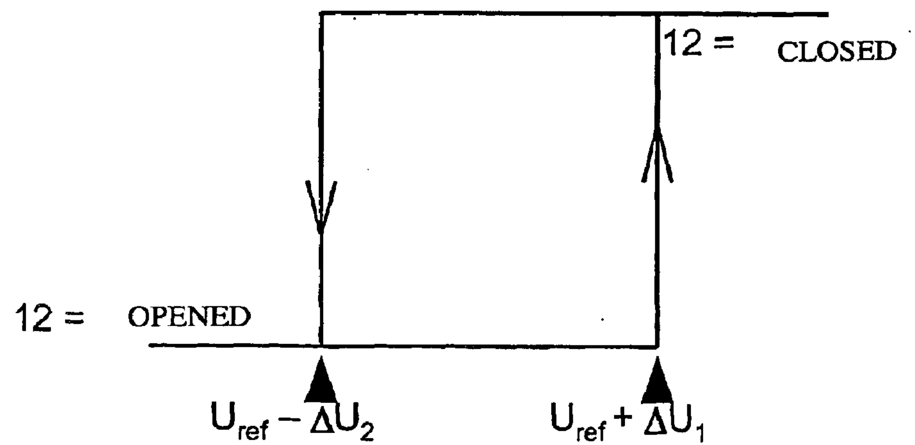
FIG. 2 illustrates the switching hysteresis of the auxiliary switch in a preferred embodiment of the invention.

In the second triggering unit 18, the voltage U applied via the energy storage device 6*a* is compared with a first value $U_{ref}+\Delta U_1$ and/or a second value $U_{ref}-\Delta U_2$ ($\Delta U_1,\Delta U_2>0$). As long as the voltage U on the first energy storage device 6*a*, coming from below, remains below the predetermined first value $U_{ref}+\Delta U_1$, then the current I flowing through the self-conducting semiconductor switch 4 is passed through the first energy storage device 6*a* and the rectifier 8*a* (12=OPENED). When the voltage U on the first energy storage device 6*a* reaches the predetermined first value $U_{ref}+\Delta U_1$ coming from below, the current I is diverted by the first energy storage device 6*a* by closing the auxiliary switch 12 (12=CLOSED). As soon as the voltage U on the first energy storage device 6*a*, coming from above, has fallen below the predetermined second value $U_{ref}-\Delta U_2$, the auxiliary switch 12 is opened so that energy is again supplied to the energy storage device 6*a* via the current I. This hysteresis response is illustrated graphically in FIG. 2 (two-point regulator).

In FIGS. 3, 4 and 5, the control signal S1 for the self-conducting semiconductor switch 4, the voltage U across the energy storage device 6*a* and the control signal S2 for the auxiliary switch 12 are each plotted as a function of time. With the auxiliary switch 12 opened (control signal S2="OFF") the voltage U on the energy storage device 6*a* according to FIG. 4 increases steadily until it exceeds the predetermined first value $U_{ref}+\Delta U_1$. The second triggering unit 18*a* sets the control signal S2 at "ON," the auxiliary switch 12 is closed and the voltage U on the energy storage device 6*a* gradually begins to drop according to the power demand of the control circuit 14.

The first triggering unit 16 generates the control signals S1 for the self-conducting semiconductor switch 4 according to the requirements of the power demand of the load 2.

The voltage U on the energy storage device 6*a* gradually reaches the second value $U_{ref}-\Delta U_2$, the control signal S2 for the auxiliary switch 12 is set at "OFF" and the voltage U on the first energy storage device 6*a* begins to rise again as soon as the control signal S1 for the self-conducting semiconductor switch 4 is set at "1." During the ON times of the self-conducting semiconductor switch 4, the voltage U thus increases in sections until again reaching the first value $U_{ref}+\Delta U_1$ and the auxiliary switch 12 is opened again.

Figure 6:
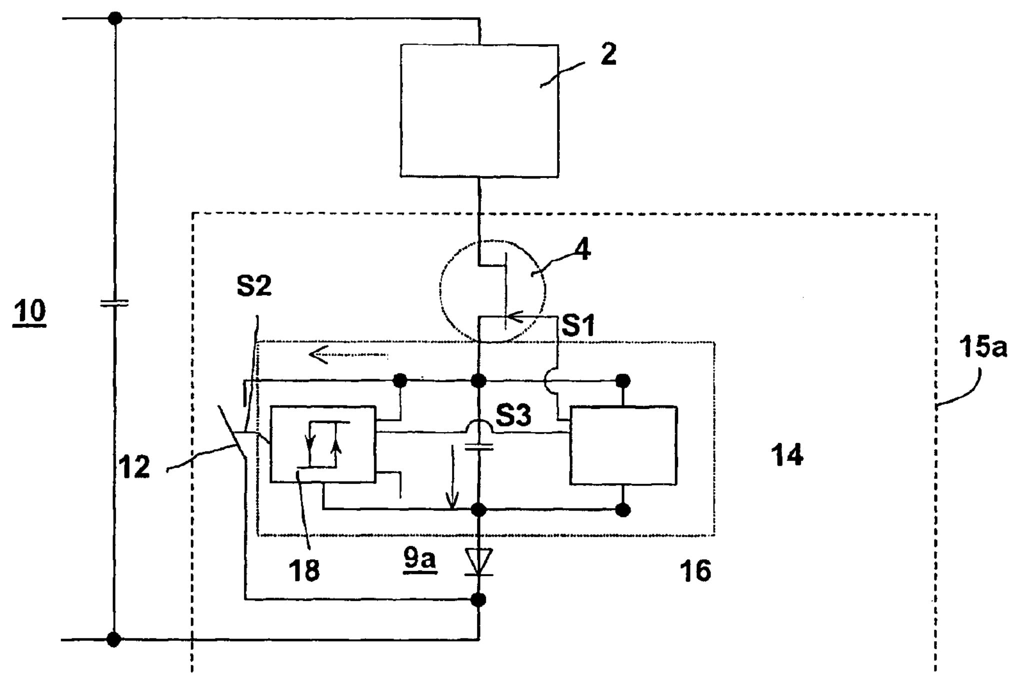
FIG. 6 is another circuit arrangement according to this invention, likewise in a schematic diagram.

In a preferred embodiment, the switching times ti, $ti_{+1}$, . . . are selected so that they each fall in intervals Δt in which the self-conducting semiconductor switch 4 is opened. To do so it is necessary for the first triggering unit 18 to process a release signal S3 for release of the switching command which is supplied by the first triggering unit 16 according to the exemplary embodiment illustrated in FIG. 6.

Figure 7:
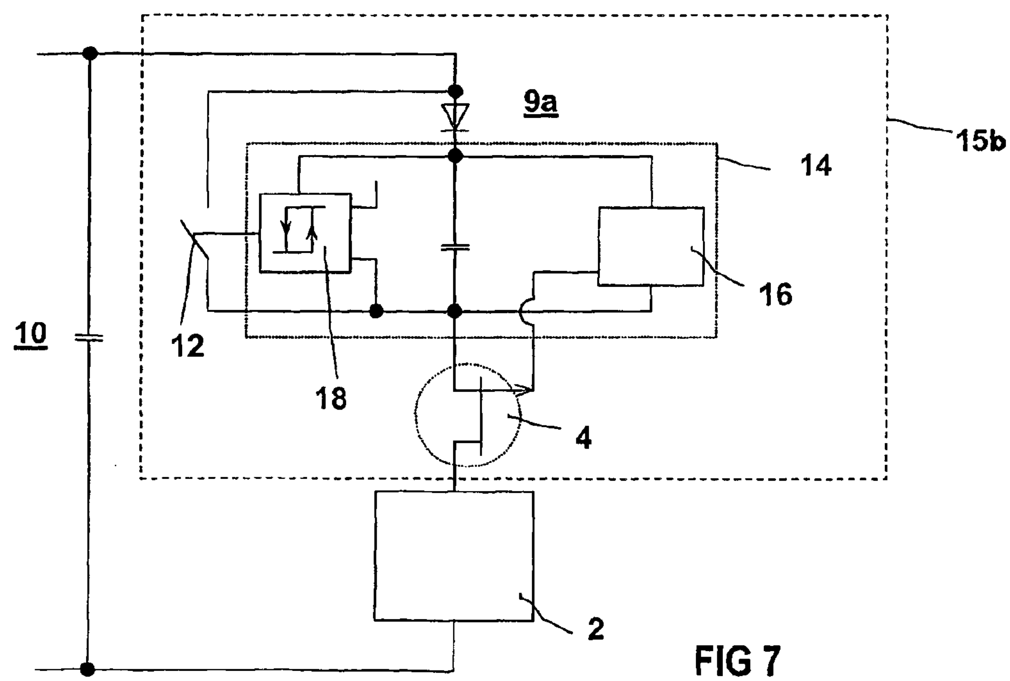
FIG. 7 shows a circuit arrangement according to this invention having a p-channel VJFET.

In the exemplary embodiment according to FIG. 7, a p-channel VJFET is used instead of an n-channel VJFET. In this case the gate potential must be raised for turning off via the source potential so that the energy storage circuit 9*a* must be connected upstream from the self-conducting semiconductor switch 4. The entire circuit arrangement then forms a p-channel switching element 15*b* by analogy with the exemplary embodiment according to FIG. 1.

Figure 8A:
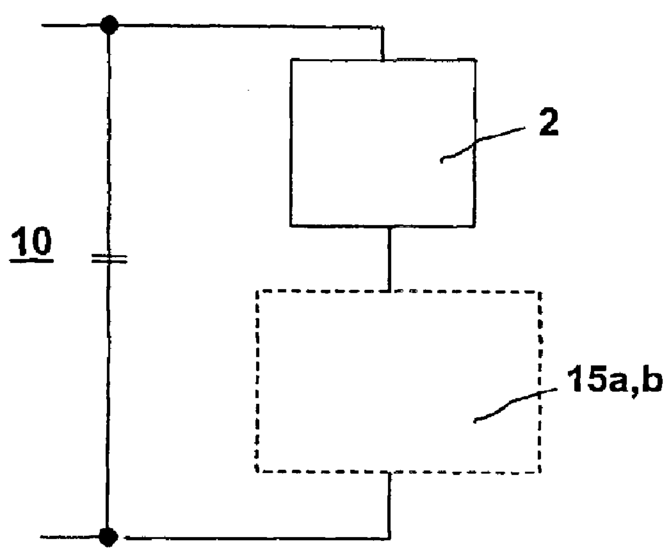
FIGS. 8*a* and 8*b* show basic arrangements of the inventive circuit arrangement relative to the load.
Figure 8B:
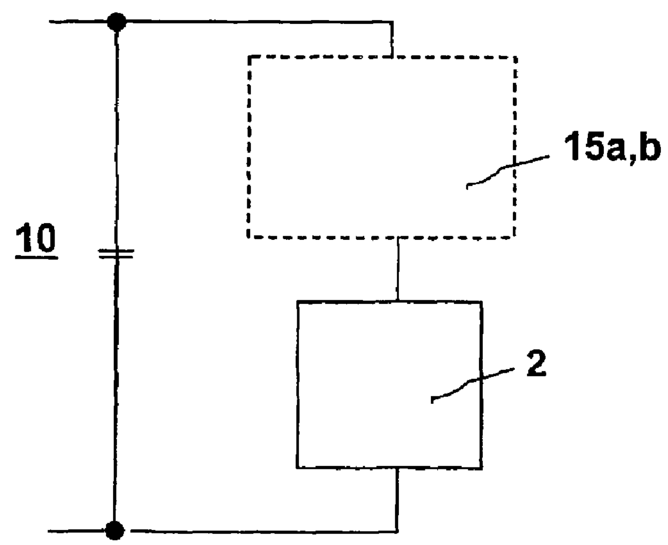

FIGS. 8*a* and 8*b* show that the n-channel switching element 15*a* and the p-channel switching element 15*b* may be connected either upstream or downstream from the load 2.

By diverting the current flow via the energy storage device 6*a*, a lower voltage time area (integral of the voltage over time) is applied to the load 2 than is the case with the auxiliary switch 12 closed. Therefore, during the times in which the auxiliary switch 12 is opened, the ON time of the self-conducting semiconductor switch 4 is preferably lengthened during the off time of the auxiliary switch 12 with a logic implemented, e.g., in the first triggering circuit 16 or in a higher-level control unit which controls the former, so that the voltage time area which would result if the auxiliary switch 12 were closed is also applied to the load 2 in this off time.

Figure 9:
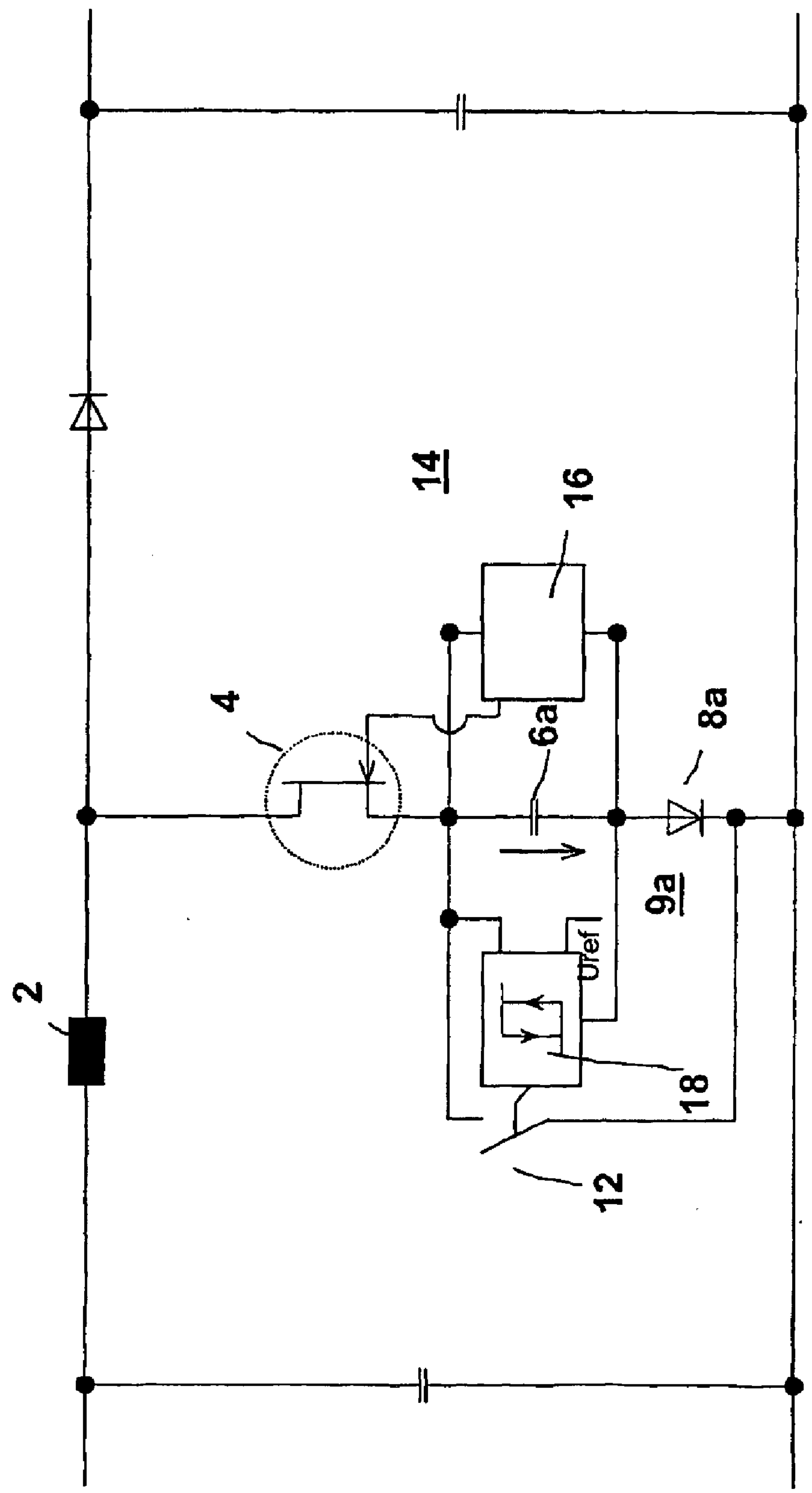
FIG. 9 illustrates a step-up converter as an example of an application for the inventive circuit arrangement.

In the exemplary embodiment according to FIG. 9, the circuit arrangement according to this invention is used in a step-up converter. In this application, it should be taken into account in the design of the first energy storage device 6*a* that the current flowing through the self-conducting semiconductor switch 4 is very small in the range of the zero passage of the input current. In this application case, the prerequisite for the applicability of the inventive circuit arrangement is that the step-up converter must not be operated in an idle state, and the power consumption by the load must always be so high that the self-conducting semiconductor switch 4 is switched on for a sufficiently long period of time to maintain the voltage on the first energy storage device 6*a*.

Figure 10:
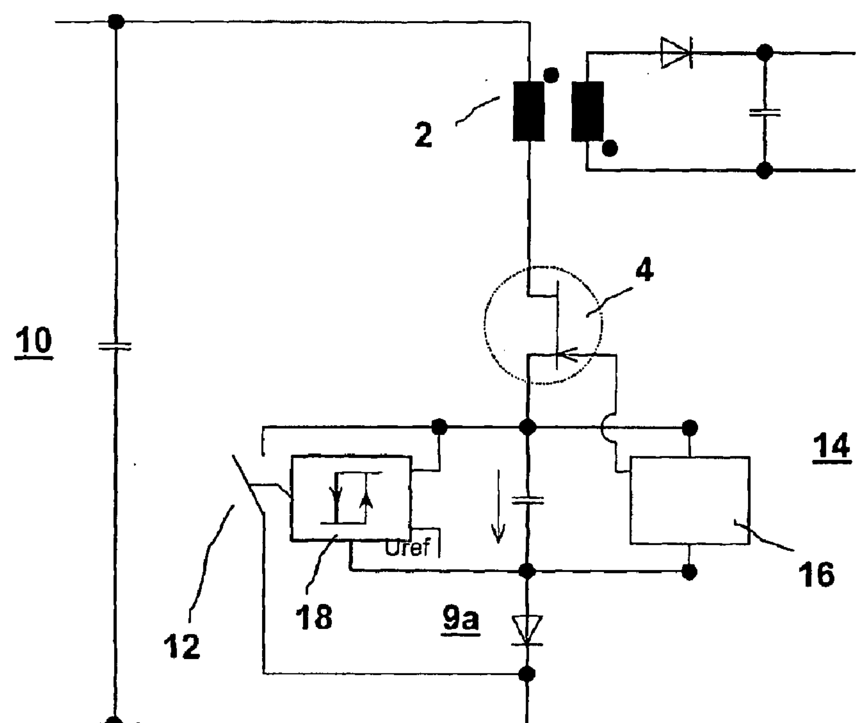
FIG. 10 shows an isolating transformer as another example of an application for the inventive circuit arrangement.

This is also true of the exemplary embodiment shown in FIG. 10 in which the inventive circuit arrangement is used in an isolating transformer.

Figure 11:
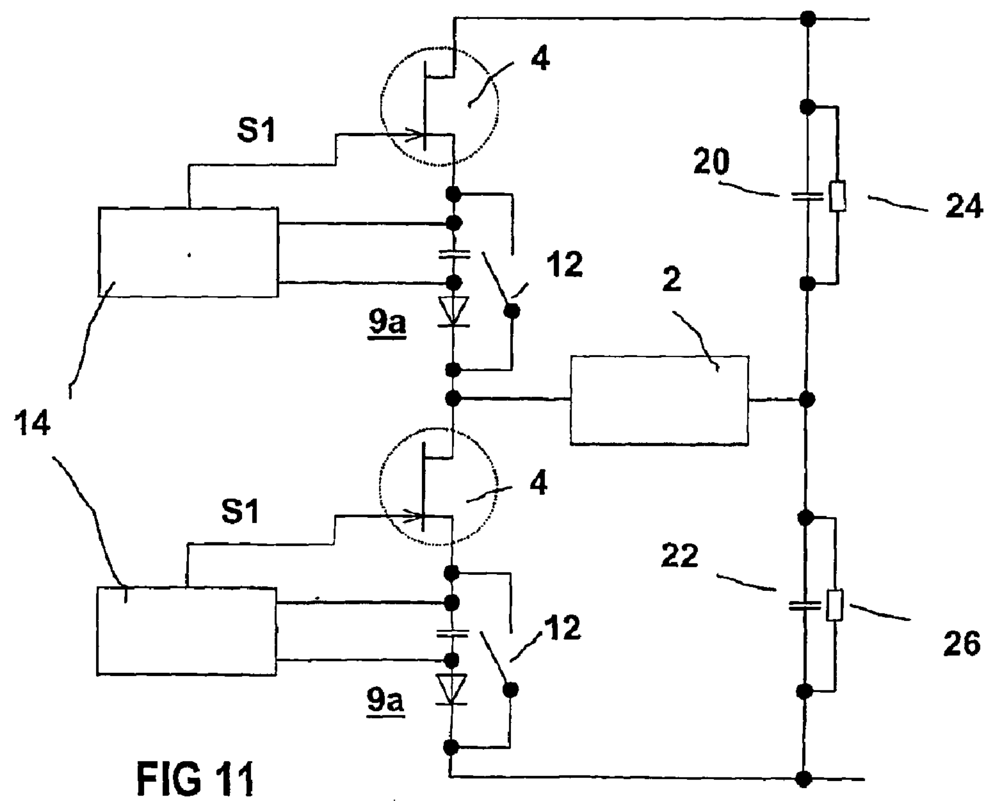
FIG. 11 illustrates use of the inventive circuit arrangement in a bridge circuit.

In the exemplary embodiment according to FIG. 11, the use of the inventive circuit arrangement in a symmetrical half-bridge circuit, which operates against a capacitance neutral point is illustrated. In this embodiment, asymmetries and/or symmetries in the voltage on the load 2 may occur due to tolerances in the load of the first energy storage device 6*a* due to the control circuit 14. As a result, an unequal distribution of the intermediate circuit voltage occurs among the two series-connected intermediate circuit capacitors 20, 22. The asymmetry, which occurs due to the tolerance of the load of the energy storage device 6*a*, can be eliminated through a suitable design of the balancing resistors 24, 26 in relation to the intermediate circuit capacitors 20, 22. Additionally or alternatively, it is also possible to detect the switching states of the self-conducting semiconductor switches 4 and to lengthen the control signals Si with the auxiliary switch 12 opened so that the voltage-time area which is applied to the load 2 is that which would be applied if the auxiliary switch 12 were closed.

Figure 12:
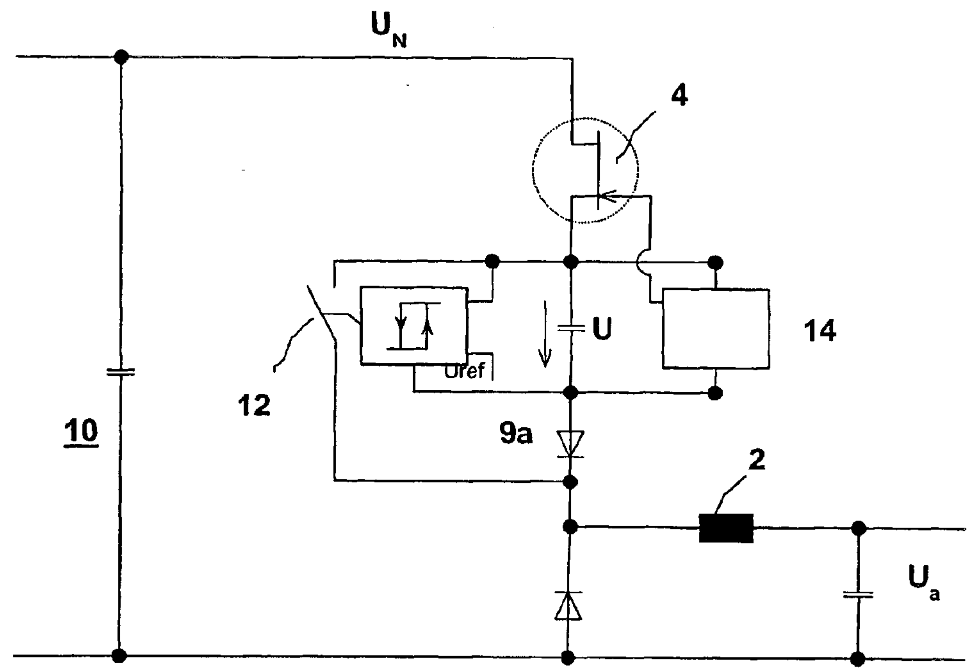
FIG. 12 illustrates use of the inventive circuit arrangement in a step-down converter.

FIG. 12 shows the use of the inventive circuit arrangement in a step-down converter.

This is possible if its output voltage Ua need not be set at zero and/or need not be higher than a value which corresponds to the difference between the input voltage $U_N$ and the voltage $(U_N-U)$ on the energy storage device 6*a*.

Figure 13:
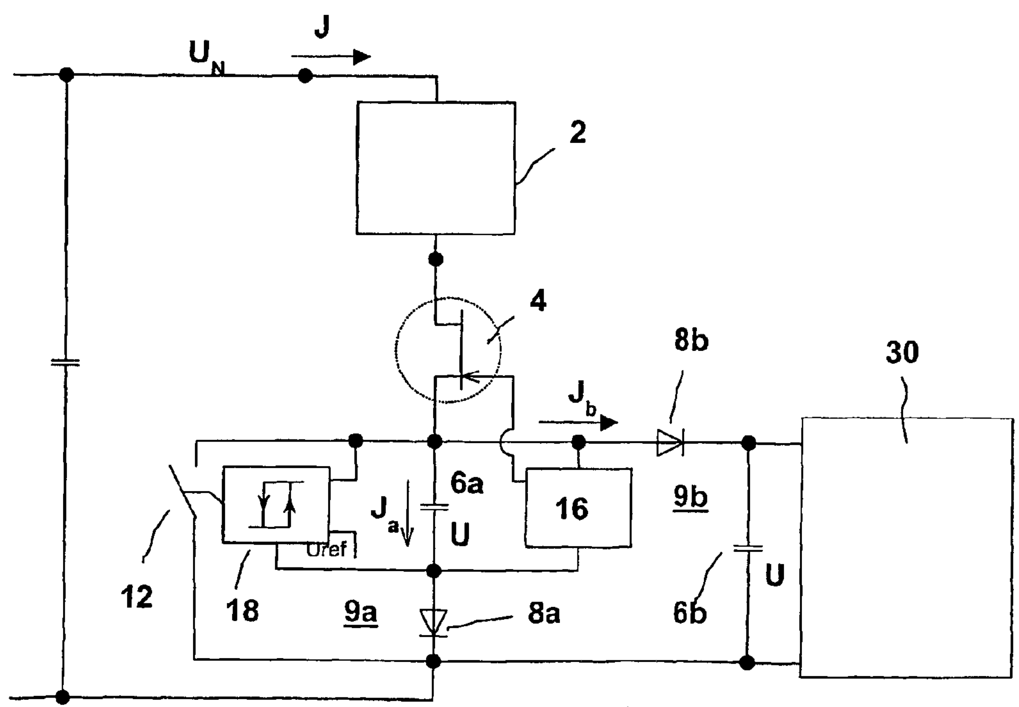
FIGS. 13 and 14 show a circuit arrangement in each in which a unipolar or bipolar power supply voltage is generated for additional consumers with the help of additional energy storage units.

In the exemplary embodiment according to FIG. 13, a second energy storage circuit 9*b* constructed from a series connection of two rectifiers 8*c* and a second energy storage device 6*b* is connected in-parallel with the series connection of the first energy storage device 6*a* and the first rectifier 8*a*, whereby the second rectifier 8*b* is connected between the self-conducting semiconductor switch 4 and the second energy storage device 6*b*. When the self-conducting semiconductor switch 4 is turned on and the auxiliary switch 12 is turned off, the current I flowing through the load 2 is divided between the current paths I1 and I2 via the first energy storage device 6*a* and/or the second energy storage device 6*b*. Thus the same voltage U is established on the two energy storage devices 6*a*, 6*b*. The second energy storage device 6*b* is always connected to the negative potential of the intermediate circuit regardless of the switch state of the self-conducting semiconductor switch 4 and the auxiliary switch 12. Thus, in this exemplary embodiment, additional consumers 30 which should assume a fixed reference potential with respect to the power supply voltage (input voltage $U_N$) can be supplied with power by the second energy storage device 6*b*.

Figure 14:
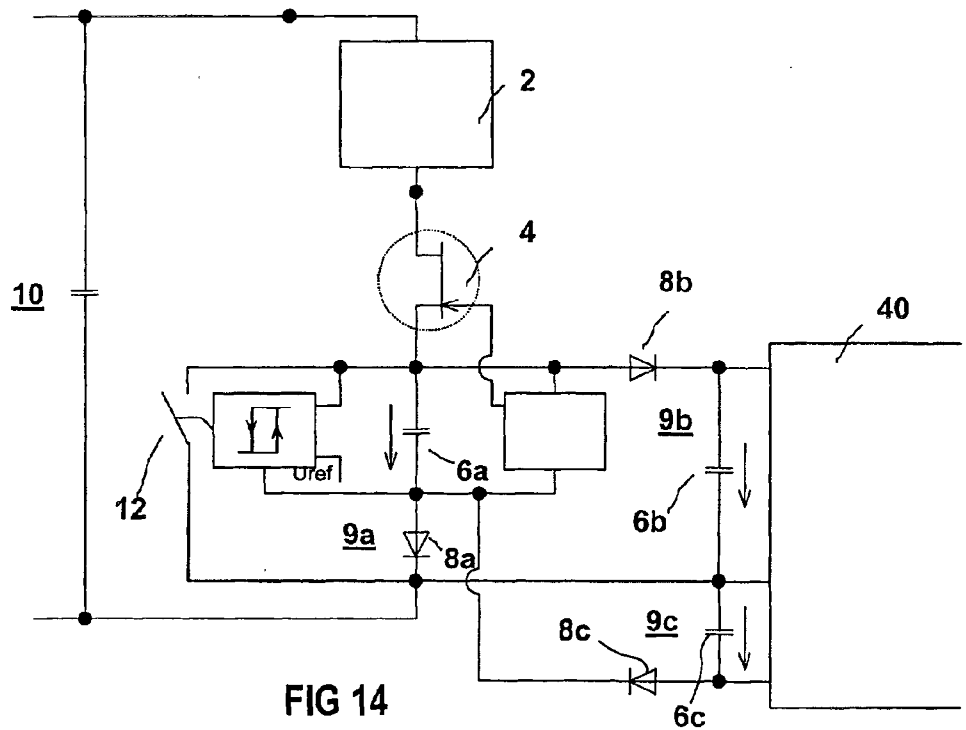

According to FIG. 14 a third energy storage circuit 9*c*, which is also made up of a series connection of a third rectifier 8*c* and a third energy storage device 6*c* is connected in-parallel with the first rectifier 8*a*, such that when the auxiliary switch 12 is closed, a current flow is established from the first energy storage device **6*a* via the auxiliary switch 12, the third energy device 6*c* and the third rectifier 8*c*, the cathode of the diode of the third rectifier 8*c* being connected to the anode of the diode of the first rectifier 8*a*** in the case of diodes used as rectifiers in the exemplary embodiment.

If the auxiliary switch 12 is closed, power is distributed from the first energy storage device **6*a* into the third energy storage device 6*c*. Since the power for the third energy storage device 6*c* is stored temporarily in the first energy storage device 6*a* , the (storage) capacity of the third energy storage device 6*c* is smaller than the (storage) capacity of the first energy storage device 6*a*. A consumer 40 which needs a bipolar power supply voltage can then be supplied directly from the second and third energy storage devices 6*b* and 6*c***, respectively.

Figure 15:
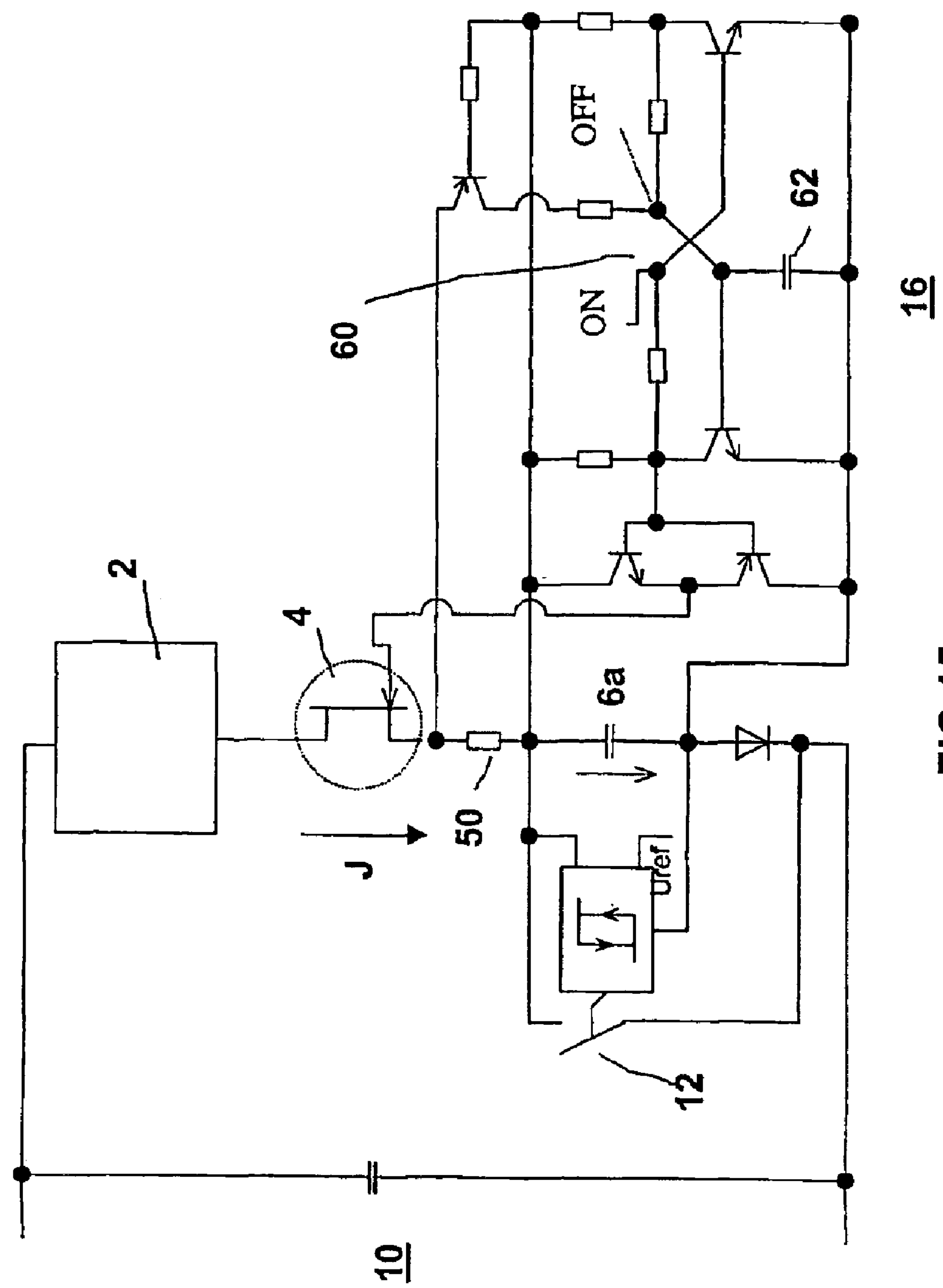
FIG. 15 illustrates a circuit arrangement according to the present invention, additionally having an overcurrent protective device for the self-conducting semiconductor switch.

In the exemplary embodiment according to FIG. 15, a current detecting unit 50, e.g., an ohmic resistor, is connected in-series with the self-conducting semiconductor switch 4. The voltage drop across this resistor is a measure of the current I flowing through the self-conducting semiconductor switch 4. When this current is higher than a predetermined allowed current, a bistable flip-flop of a protective device 60 implemented in the first triggering unit 16 is switched so that it opens the self-conducting semiconductor switch 4. By means of a capacitor 62 it is ensured that the bistable flip-flop does not cause the self-conducting semiconductor switch 4 to be turned off in ramping up. Some time after the safety device 60 responds, the voltage on the first energy storage device **6*a* will no longer be sufficient (due to load currents and leakage currents) to block the self-conducting semiconductor switch 4. When the self-conducting semiconductor switch 4 is subsequently turned on, the first energy storage device 6*a* is again charged up to its operating voltage. Unless a shutdown command is specified externally, the self-conducting semiconductor switch 4** is turned off again via the current detection and the flip-flop connected downstream. This process may be repeated as often as needed.

Figure 16:
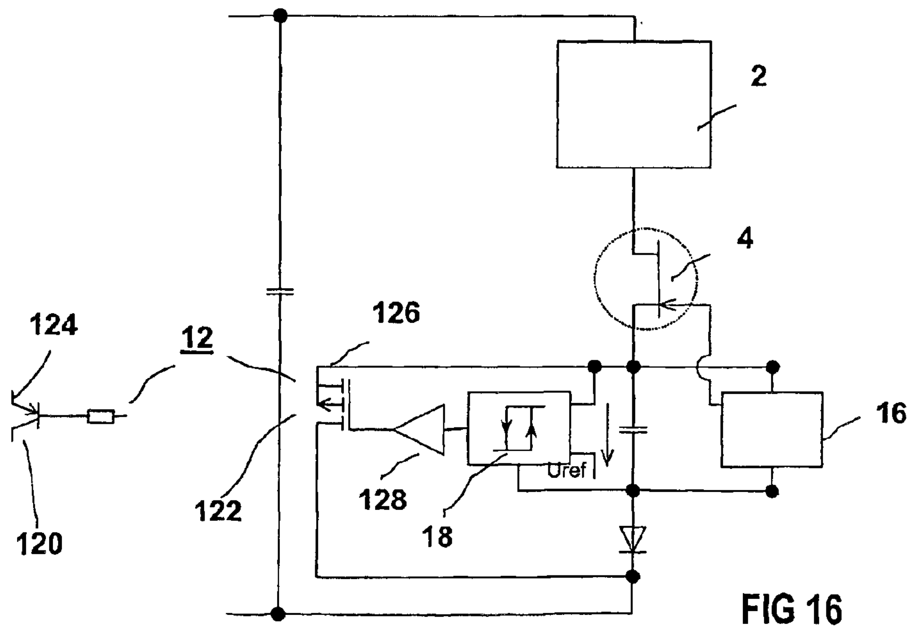
FIGS. 16 and 17 illustrate additional advantageous embodiments of the circuit arrangement according to this invention, using a p- or an n-channel MOSFET as the auxiliary switch.

In the exemplary embodiment according to FIG. 16, the auxiliary switch is designed as a pnp-transistor 120 or as a p-channel MOSFET 122. The first energy storage device **6*a* supplies a potential, which is negative with respect to the source terminal 126 and/or the emitter terminal 124, so the pnp-transistor 120 and p-channel MOSFET 122 can be triggered via a simple driver stage 128**.

Figure 17:
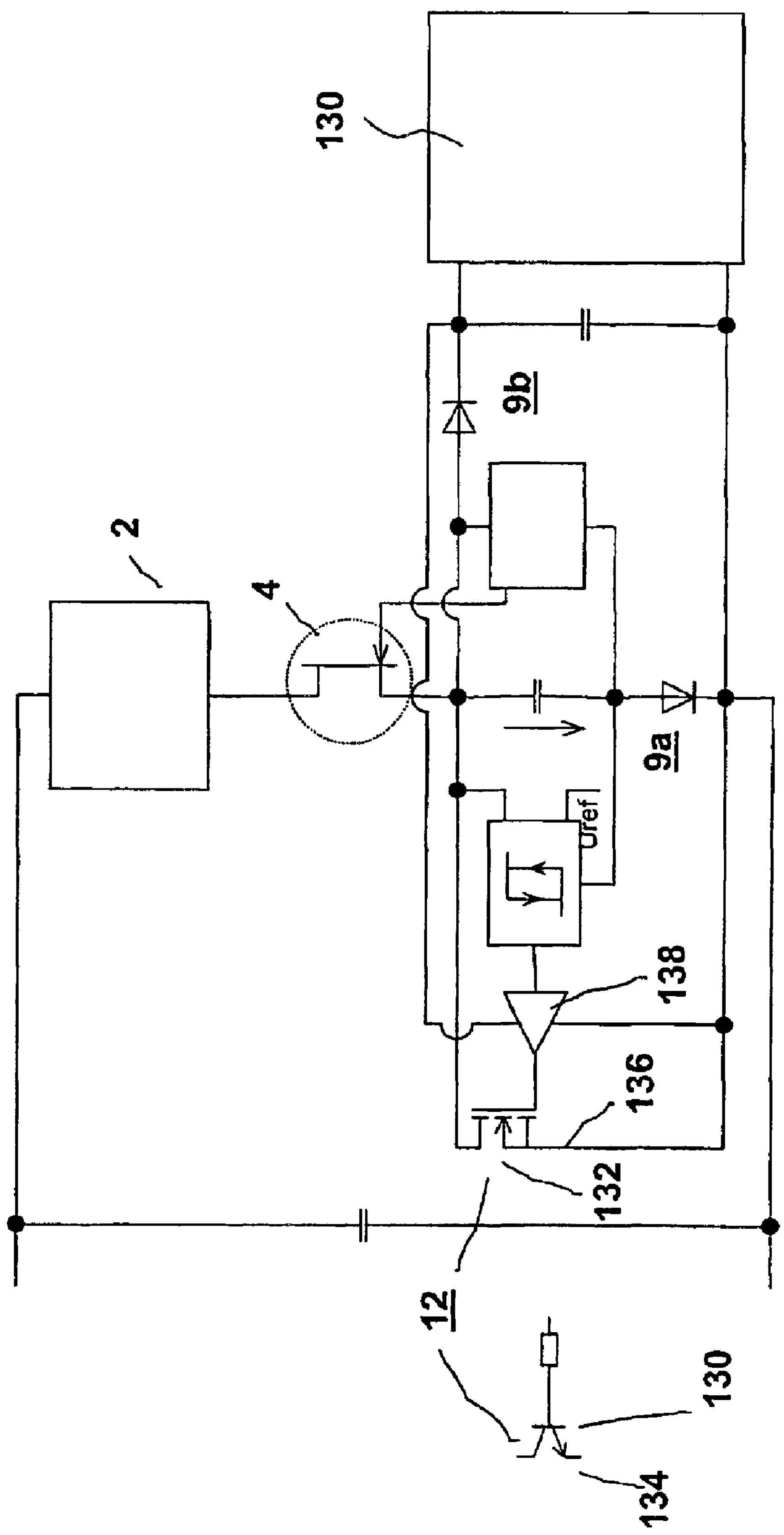

In the exemplary embodiment according to FIG. 17, the auxiliary switch 12 is designed as an npn-transistor 130 or as an n-channel MOSFET 132. In this exemplary embodiment, however, the auxiliary switch 12 must be triggered via a driver stage 138, which at any point in time has a potential that is positive with respect to the emitter terminal 134 and/or the source terminal 136. To make this possible, the driver stage 138 is supplied with power via the second energy storage circuit **9*b* which has already been explained in conjunction with the exemplary embodiment according to FIG. 11**.

The above description of the preferred embodiments has been given by way of example. From the disclosure given, those skilled in the art will not only understand the present invention and its attendant advantages, but will also find apparent various changes and modifications to the structures disclosed. It is sought, therefore, to cover all such changes and modifications as fall within the spirit and scope of the invention, as defined by the appended claims, and equivalents thereof.

What is claimed is:

1. A circuit for controlling power supplied to a load, the circuit comprising:

a controllable self-conducting semiconductor switch connected in-series with the load;

a first energy storage circuit connected in-series with the load, said first energy storage circuit comprising a first energy storage device and a first rectifier connected in-series, wherein a terminal of the first energy storage device is connected to a terminal of said self-conducting semiconductor switch;

a controllable auxiliary switch connected in-parallel with the first energy storage device;

a control circuit for the self-conducting semiconductor switch and said auxiliary switch, wherein said control circuit is operable to sense a voltage from the first energy storage device and close and open said auxiliary switch, respectively, when the voltage from the first energy storage device exceeds a predetermined first value and falls below a predetermined second value.

2. A circuit as claimed in claim 1, wherein the first value and the second value are different.

3. A circuit as claimed in claim 1, wherein said control circuit switches said controllable auxiliary switch only when said self-conducting semiconductor switch is opened.

4. A circuit as claimed in claim 1, further comprising:

correction means for correcting an ON time of said self-conducting semiconductor switch as a function of the switch state of said auxiliary switch.

5. A circuit as claimed in claim 4, wherein the ON time of the self-conducting semiconductor switch is increased when said auxiliary switch is opened.

6. A circuit as claimed in claim 1, wherein said control circuit comprises a monitoring device for monitoring the voltage on the first energy storage device and for generating a switching signal for closing the self-conducting semiconductor switch when the voltage on the first energy storage device falls below a predetermined limit value when the auxiliary switch is opened.

7. A circuit as claimed in claim 1, wherein said self-conducting semiconductor switch is an SiC VJFET.

8. A circuit as claimed in claim 7, wherein the SiC VJFET is current limiting.

9. A circuit as claimed claim 1, wherein the first energy storage device is a capacitor.

10. A circuit as claimed in claim 9, wherein a resonant frequency of an oscillating circuit formed by an inductive component of the load and the capacitor is much lower than the lowest switching frequency of said self-conducting semiconductor switch.

11. A circuit as claimed in claim 1, further comprising a second energy storage circuit connected in-parallel with said auxiliary switch, said second energy storage circuit comprising a second energy storage device and a second rectifier connected in-series.

12. A circuit as claimed in claim 11, further comprising a third energy storage circuit connected in-parallel with the first rectifier and operable to generate a bipolar power supply voltage jointly with the second energy storage circuit.

13. A circuit as claimed in claim 1, further comprising a protective device operable to detect an electric current flowing through the self-conducting semiconductor switch and further operable to generate a control signal for opening the self-conducting semiconductor switch when the electric current exceeds a predetermined limit value.

14. A circuit as claimed in claim 13, wherein the protective device comprises a bistable flip-flop.

* * * * *